US009479144B2

(12) United States Patent
Kuo

(10) Patent No.: US 9,479,144 B2
(45) Date of Patent: Oct. 25, 2016

(54) EXTENDED RANGE RING OSCILLATOR USING SCALABLE FEEDBACK

(71) Applicant: Analog Devices, Inc., Norwood, MA (US)

(72) Inventor: Shawn S. Kuo, Arlington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/068,824

(22) Filed: Oct. 31, 2013

(65) Prior Publication Data
US 2014/0266476 A1    Sep. 18, 2014

Related U.S. Application Data

(60) Provisional application No. 61/790,337, filed on Mar. 15, 2013.

(51) Int. Cl.
*H03K 3/03*    (2006.01)
*H03K 3/356*    (2006.01)
*H03K 3/0231*    (2006.01)
*H03K 3/017*    (2006.01)

(52) U.S. Cl.
CPC ............ *H03K 3/0322* (2013.01); *H03K 3/017* (2013.01); *H03K 3/0231* (2013.01); *H03K 3/03* (2013.01); *H03K 3/356043* (2013.01)

(58) Field of Classification Search
CPC ...... H03K 3/017; H03K 3/0231; H03K 3/03; H03K 3/356043
USPC .......................... 331/57, 177 R, 34; 327/156
See application file for complete search history.

(56) References Cited

U.S. PATENT DOCUMENTS

| | | | |
|---|---|---|---|
| 5,596,302 A | 1/1997 | Mastrocola et al. | |
| 6,717,478 B1 * | 4/2004 | Kim | H03B 5/24 331/46 |
| 7,183,864 B1 * | 2/2007 | Gutnik | 331/57 |
| 8,004,331 B2 | 8/2011 | Li et al. | |

* cited by examiner

*Primary Examiner* — Arnold Kinkead
(74) *Attorney, Agent, or Firm* — Patent Capital Group

(57) ABSTRACT

A clock system including a ring oscillator having a plurality of cascaded inverters, each of the cascaded inverters having a pair of inputs coupled to outputs of a respectively adjacent inverter stage and having a pair of outputs coupled to inputs of another respectively adjacent inverter stage, each inverter stage having a common mode control circuit provided therein, and a feedback controller adapted to transmit a control signal to the common mode control circuit of at least one of the inverters.

20 Claims, 4 Drawing Sheets

100

200

300

400

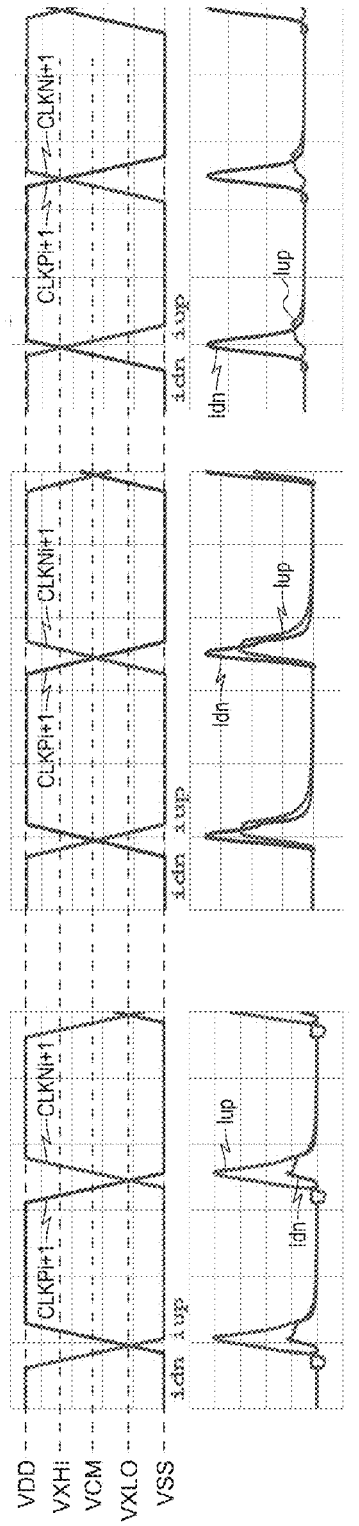
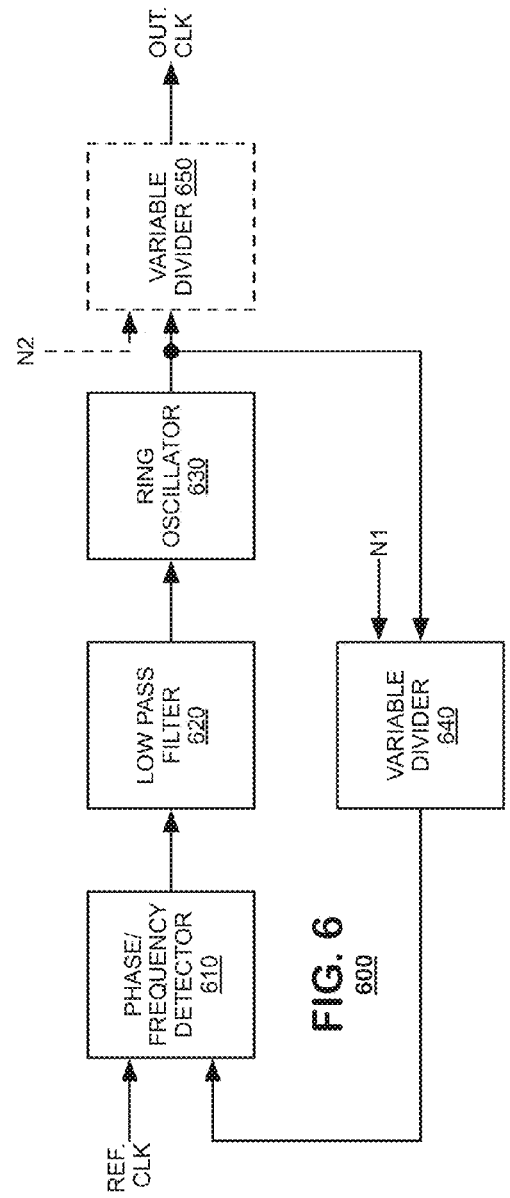
FIG. 5
500
FIG. 6
600

EXTENDED RANGE RING OSCILLATOR USING SCALABLE FEEDBACK

PRIORITY

This application claims the benefit of U.S. Provisional Patent Application No. 61/790,337 filed on Mar. 15, 2013, which is incorporated herein by reference.

BACKGROUND

Many processing systems require generation of clock signals at varying frequencies. Typically, a programmable clock generator includes tuning circuitry to define a clock frequency to be generated by the clock generator. Conventional clock generator designs include a voltage controlled oscillator with system components whose operational current is controlled to provide a clock signal at a desired frequency.

Ring oscillators are the architecture of choice to achieve higher tuning range in clock generators. The most common ways of improving tuning range is by varying the size of capacitors or transconductance elements within control circuits. However, these techniques have associated penalties. Capacitors, for example, are area-intensive devices which consume increasing amounts of area when the clock generators are manufactured in integrated circuits. At the lowest frequencies within the tuning range, the transconductance stages generate a lot of noise compared to the signal resulting in poor jitter performance. Accordingly, the inventor has identified a need in the art to provide a control circuit for clock generators that provide adequate control and mitigate against such penalties.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure.

FIG. 5 illustrates example waveforms illustrating the operation of the cross-point detector of FIG. 3 at various operational states.

FIG. 6 is a block diagram of a clock generator according to an example embodiment of the present invention.

DETAILED DESCRIPTION

Figure 1:
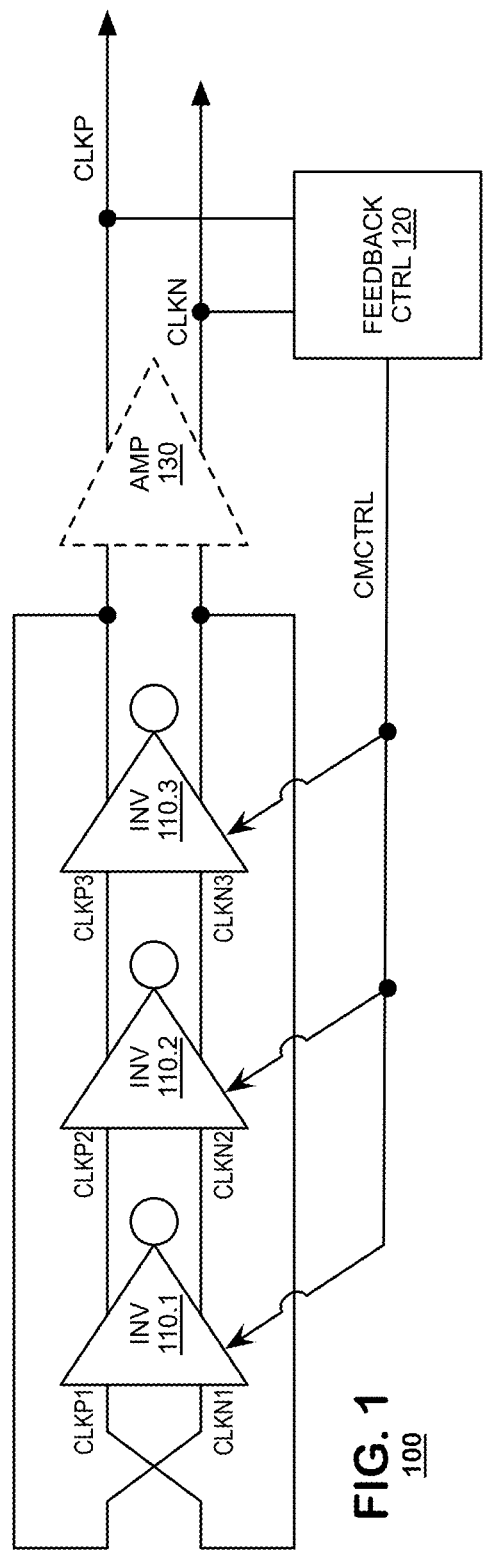
FIG. 1 is a block diagram of a clock system according to an example embodiment of the present invention.

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, and circuits have not been described in detail so as not to unnecessarily obscure aspects of the embodiments. Wherever possible, like reference numbers will be used for like elements.

Embodiments of the present invention provide an extended range voltage controlled oscillator that includes a common control mode circuit that extends the frequency range of the voltage controlled oscillator. The voltage controlled oscillator may include a differential ring oscillator. Use of a cross control circuit may extend the tuning range of the system to beyond the minimum supported frequency of other designs. Though there are many traditional ways to implement common mode feedback, cross control feedback has a few distinct advantages. The first advantage is clock fidelity and the second is clock jitter.

Typically, common mode feedback control systems are limited by pole location, which is based on RC time constants within the control circuits. Control systems that employ large resistances may involve relatively high levels of noise. Control systems that employ large capacitors involve an area penalty, as discussed. Typically, the oscillator's operating frequency must be at least 10× the pole frequency (1/RC) of the control circuits. The techniques proposed herein, however, may cause the pole location to vary with the oscillator's operational frequency and, as a consequence, may break the 10× limitations of those other designs.

A cross control circuit can keep output signals more differential than traditional common mode feedback methods. Traditional methods measure common mode voltage in continuous time. At low frequency clocks the common mode circuit is measuring a static clock signal that has no information. Therefore, the accuracy of traditional common mode methods degrades as the clock frequency decreases. For cross control circuitry, common mode is only measured during clock transitions therefore accuracy is maintained at all frequencies. This allows the voltage controlled oscillator to implement higher fidelity clocks and/or achieve lower oscillating frequencies than traditional common mode circuits.

Another benefit of the cross control circuit is lower noise, and hence lower jitter, in the voltage controlled oscillator. A cross control circuit only generates an output during clock transitions which are the only times when signal information is present in the clock signals. During the static portion of the output clock, traditional common mode circuits will output a signal that contains no clock information but presents noise to the system.

The circuit may be realized using a differential pair that is actively loaded as the ring oscillator cell. Three or more cells can be put together to generate the ring oscillator. The current source and active load of the ring oscillator cell will be controlled by the voltage controlled oscillator control voltage (input) and cross-control common mode feedback. The cross control circuit may drive an active load or a current source.

FIG. 1 is a block diagram of a clock system 100 according to an example embodiment. The clock system may include a differential ring oscillator 110, a feedback controller 120, and optional buffer 130.

As shown in FIG. 1, the differential ring oscillator 110 may include a plurality of cascaded inverters 110.1-110.N. For example, inverters 110.1-110.N may be differential inverters, which are supplied input clock signals CLKPi, CLKNi from a preceding inverter stage and generate an output clock signals CLKPi+1, CLKNi+1 to a succeeding stage. A clock output from a final inverter (e.g., inverter 110.3 in the example of FIG. 1) may be input to the first inverter stage 110.1 in the ring oscillator 110 through a feedback loop.

Accordingly, intermediate nodes may be formed between successive stages of the cascaded inverters, each node having corresponding clock signals CLKPi, CLKNi. In some instances, each of the clock signals may be routed from a respective intermediate node to a subsequent receiving circuit, such as a signal processing system.

Each stage of inverters 110.1-110.N may be configured with a predetermined delay. In some instances, the predetermined delay for each of the inverters INV.1-INV.N may be a unit delay. Alternatively, the predetermined delay for each of the inverters INV.1-INV.N may be variable among the inverters.

In the embodiment of FIG. 1, the ring oscillator 110 is depicted as having three stages, but other implementations may have a greater number of inverter stages to suit individual application needs. Typically, the differential ring oscillator 110 includes at least three stages of inverters 110.1-110.3 connected in a ring. In various embodiments, the number of N cascaded inverters INV.1-INV.N may be implemented using any even or odd number of inverters.

The feedback controller 120 may manage operation of the differential ring oscillator 110. The output clock signals CLKP, CLKN may be input to feedback controller 120, which may generate one or more feedback control signals that may be routed back to the inverters 110.1-110.N. to correct operational errors in the inverters 110.1-110.N. For example, the feedback controller 120 having inputs for clock signals CLKP, CLKN output from the ring oscillator that generates a common mode control signal CMCTRL to the inverters 110.1-110.N. In addition, the feedback controller 120 may be a cross control block and an active or passive integrator.

Optionally, the clock generator 100 may include a buffer 130 adapted to amplify a clock signal output from the ring oscillator 110. For example, an amplifier 130, as shown in FIG. 1, may amplify clock signals CLKP, CLKN output from the ring oscillator 110 before outputting the clock signals from the clock generator 100. Output clock signals CLKP, CLKN may be taken from the output of one of the inverters in the ring oscillator 110 (e.g., inverter 110.3 in the example of FIG. 1). The ring oscillator 110 or amplifier 130 transmits the (amplified) clock signals to a subsequent receiving circuit, such as a signal processing system.

The ring oscillator 110 may not require a master clock for operation; rather, initialization of the cascaded inverters may generate each of clock signal CLKP, CLKN. The period for each clock signal CLKP, CLKN may be proportional to the number N of cascaded inverter 110.1-110.N delays present in the ring oscillator 110. For example, a ring oscillator 110 that includes seven cascaded inverters (e.g, 110.1-110.7), each with a 1 unit time delay may generate fourteen offset clock signals, each having a period of fourteen units. Each of the fourteen clock signals would be offset from each other by one unit. Here, a "wave" of transitions has to pass through the entire ring to define one period. The first time the wave passes by a given inverter, it causes one state change in the clock signal (e.g., high to low). The second time it passes by, it causes a second state change (low to high). So, seven inverters each with 1 unit of delay causes a period of 14 each offset from each other by 1 unit. In addition, the controller 120 may process the clock signals CLKP, CLKN according to the period of their respective duty cycles.

Figure 2:
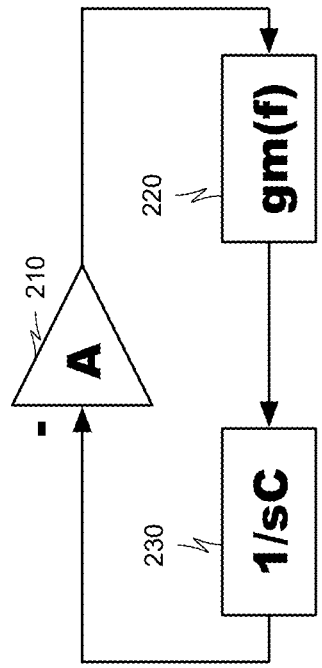
FIG. 2 is a model of the loop dynamics of a common mode feedback control system for a clock generator according to an example embodiment of the present invention.

FIG. 2 illustrates loop dynamics of a common mode feedback control system 200 for a clock generator according to an example embodiment. The system 200 may include an amplifier 210, a trans-conductance stage 220, and a filter 230.

Here, amplifier 210 represents the common mode gain of the ringer oscillator 110 and optional amplifier 130. Trans-conductance stage 220 has as an input coupled to the output of amplifier 210 (i.e., ringer oscillator 110 and optional amplifier 130). The input of trans-conductance stage 220 corresponds to output clock signals CLKP, CLKN and has a trans-conductance that is proportional to the oscillation frequency of the ring oscillator 110. Filter 230 has an input coupled to the output trans-conductance stage 220 and an output corresponding to the feedback control signal CMCTRL of the feedback controller 120.

As depicted in FIG. 2, the feedback control system 200 illustrates the use of negative gain to generate negative feedback. This negative sign can be in any of the three blocks or all three blocks as long as the total sum of negative signs is an odd number.

During operation, the integrator 230 will integrate the difference between the target common mode and actual common mode voltage set by the trans-conductance stage 220. When the actual common mode equals the target common mode, the integrator output will hold steady. The output of ring oscillator 110 will output a differential clock with the proper common mode at this time.

Operation of the feedback control system 200 may proceed iteratively over time. Its loop dynamics may be governed by Black's formula:

$$H(s) = \frac{1}{1 + A\left(gm(f)\frac{1}{sC}\right)} = \frac{1}{A \cdot gm(f)} \frac{sC}{\frac{C}{A \cdot gm(f)}s + 1}$$

Here, "s" represents frequency in the Laplace Domain, "gm(f)" represents gain of the trans-conductance stage 220 as a function of oscillating frequency "f", "A" represents the gain of the ring oscillator and optional amplifier 210, and "C" represents a capacitance of the integrator 230.

As can be understood from Black's formula, the pole A·gm(f)/C may move as a function of the oscillating frequency of the feedback system, which, by design, may keep the feedback loop inherently stable.

Figure 3:
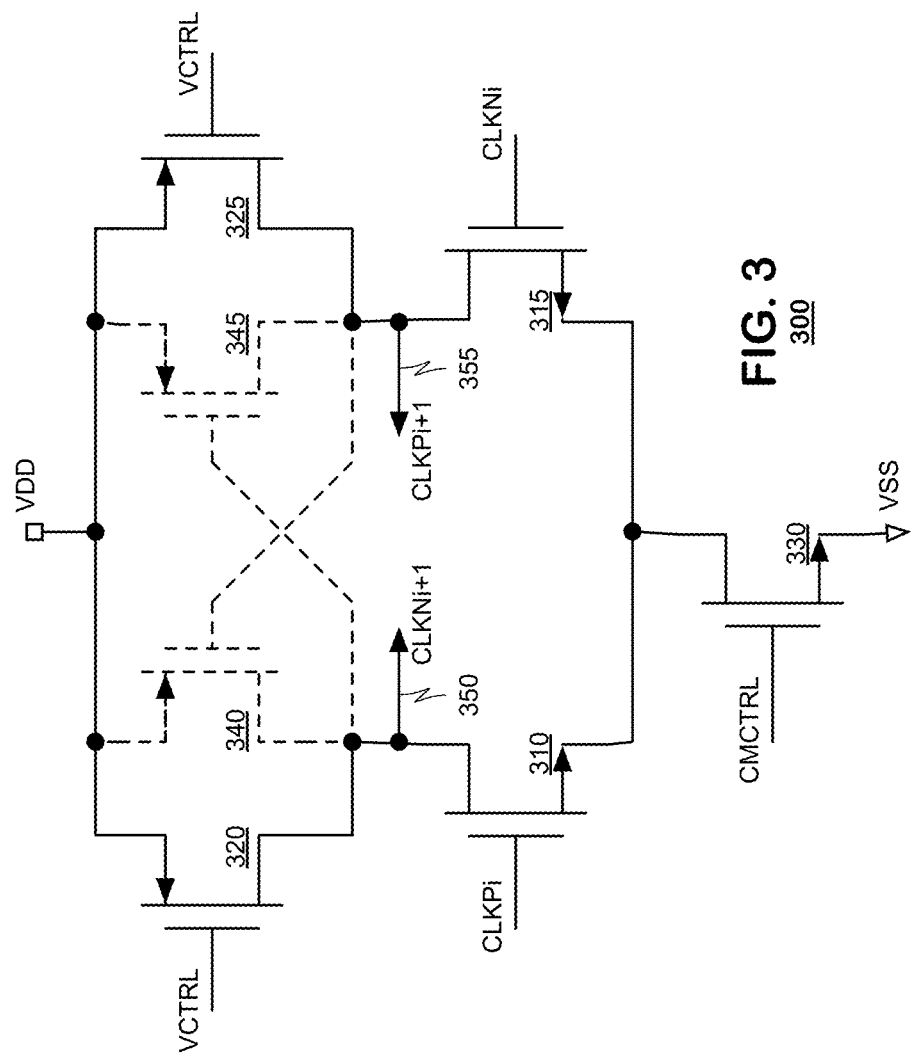
FIG. 3 is a circuit diagram of a differential pair according to an example embodiment of the present invention.

FIG. 3 is a circuit diagram of a differential pair 300 according to an embodiment of the present invention. The differential pair 300 may find application as an inverter 110.1-110.N in the ring oscillator of FIG. 1.

As shown in FIG. 3, the differential pair 300 may include a pair of input transistors 310, 315 each having an input coupled to a respective clock input CLKPi, CLKNi and coupled to a respective output terminal 350, 355 at their drains. In addition, the differential pair 300 may include a pair of bias transistors 320, 325, coupled between a first voltage supply VDD and a respective output terminal 350, 355 and having a gate respectively coupled to a control voltage VCTRL. A common mode control transistor 330 may be coupled between sources of the input transistors 310, 315 and a second supply voltage VSS and have an input for a common mode control signal CMCTRL. In some instances, the differential pair 300 may include an optional pair of cross-coupled feedback transistors 340, each coupled between the first voltage supply VDD and respective output terminals 350, 355 and having its gate coupled to a counterpart output terminal 355, 350.

The common mode control signals CMCTRL may be supplied by a feedback controller 120 as in FIG. 1. The VCTRL control signal may be provided by a second control circuit that sets the operational frequency of the ring oscillator, such as the control circuit shown in FIG. 6.

During operation, the CMCTRL signal may cause the common mode control transistor 330 to operate as a current source, passing a predetermined amount of current between VDD and VSS that is split among two circuit branches: a first circuit branch formed by transistors 310 and 320, and a second circuit branch formed by transistors 315 and 325. The VCTRL signal may set a conductance of the transistors 320 and 325, which may act as load devices on the inverter output terminals 350, 355. Thus, the transistors 320, 325 may determine a speed at which the inverter 300 changes state of output signals CLKPi+1 and CLKNi+1 in response to input signals CLKPi and CLKNi.

With a properly set common mode voltage, the inverter 300 toggles from one output state to another. Consider an example where the inverter 300 is outputting VDD on output terminal 350 (CLKNi+1) and VSS on output terminal 355 (CLKPi+1) in response to previously-asserted input signals CLKPi and CLKNi. When the input signals CLKPi and CLKNi change state, the inverter 300 may transition its output state accordingly. Specifically, output signal CLKPi+1 may transition to VDD and output signal CLKNi+1 may transition to VSS.

When CLKPi transitions to VDD, the input transistor 310 may become conductive, which may cause a voltage at the output terminal 350 to transition from VDD toward VSS. At the same time, the CLKNi input signal may transition to VSS, which may cause the input transistor 315 to become non-conductive. Transistors 320, 325 and 330 may remain conductive as determined by the VCTRL and CMCTRL signals. Thus, output terminal 350 may be pulled to VSS and output terminal 355 may be pulled to VDD. Doing may cause output signal CLKPi+1 to transition to VDD and output signal CLKNi+1 to transition to VSS.

In an embodiment that includes the feedback transistors 340 and 345, the cross-coupled transistors 340, 345 may provide positive feedback to the inverter's response. Continuing with the foregoing example, as output terminal 350 transitions from VDD toward VSS, the transitioning voltage also may cause the feedback transistor 345 to become conductive. The feedback transistor 345 also may pull the output terminal 355 toward VDD in concert with transistor 325. As the output terminal 355 transitions to VDD, the transitioning voltage at the output terminal 355 may cause the second feedback transistor 340 to become non-conductive.

The common mode control transistor 330 may set transition cross-points of the output signals on the output terminals 350 and 355 at a cross-point voltage that is at an intermediate level between VDD and VSS. The common mode control transistor 330 may be set to a conductance state that varies according to deviations from the transition cross points from an ideal value. If the cross-point voltage of the CLKPi+1 and CLKNi+1 signals are detected to be too low, then the common mode control signal CMCTRL may decrease the conductance of the transistor 330 to increase the cross-point voltage. Similarly, if the cross-point voltage of the CLKPi+1 and CLKNi+1 clock signals are detected to be too high, then the common mode control signal CMCTRL may increase the conductance of the transistor 330 to decrease the cross-point voltage.

As indicated, variations in the VCTRL signal will change the transition speed of the inverter 300 and, by extension, the oscillating frequency of the ring oscillator. The common mode feedback signal CMCTRL will vary accordingly, described in further detail below, which keeps the ring oscillator 110 running in the proper operating range.

The circuit diagram illustrated in FIG. 3 illustrates use of MOS transistors in a circuit configuration in which the VDD voltage is higher than the VSS voltage. The principles of the present invention, however, are not so limited. The inverter 300 may be implemented using other types of transistors, such as bipolar junction transistors (BJTs) or field effect transistors (FETs). Further, the device types may be inverted from the orientation shown in FIG. 3 in other implementations. For example, in the example of FIG. 3, transistors 310, 315 and 330 are shown as PMOS transistors and transistors 320, 325, 340 and 345 are shown as NMOS transistors. In another implementation, transistors 310, 315 and 330 may be provided as NMOS transistors and transistors 320, 325, 340 and 345 may be provided as PMOS transistors; in such an implementation, the VDD voltage would be lower than the VSS voltage.

Figure 4:
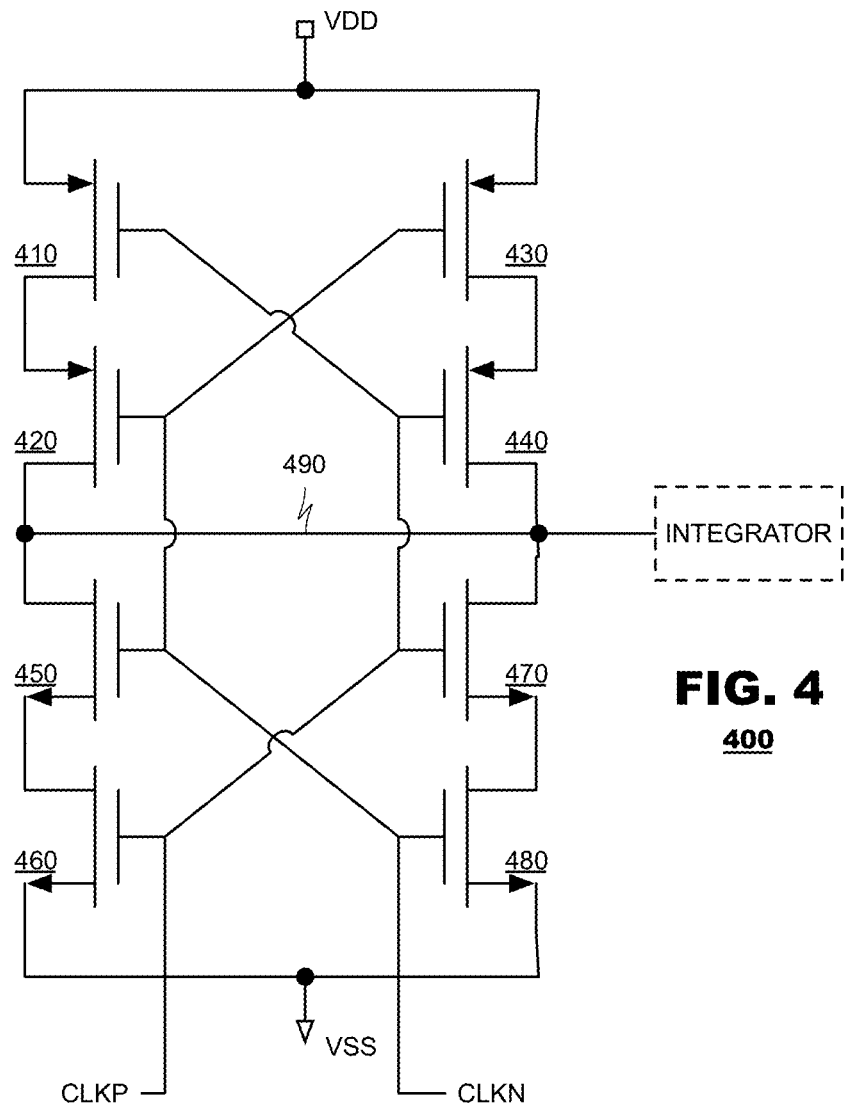
FIG. 4 is a circuit diagram of a cross-point detector according to an example embodiment of the present invention.

FIG. 4 is a circuit diagram of a cross-point detector 400, according to an example embodiment.

As shown in FIG. 4, the cross-point detector 400 may include two pairs of series connected transistors 410/420, 430/440 connected between the first supply voltage VDD and an output terminal 490, each pair 410/420, 430/440 having a different device type than the other pair (i.e., PMOS vs. NMOS). The cross-point detector 400 may further include two pairs of series-connected transistors 450/460, 470/480 connected between the second supply voltage VSS and the output terminal 490, each pair 450/460, 470/480 having a different device type than the other pair (i.e., PMOS vs. NMOS).

The cross-point detector 400 may receive differential clock signals CLKP, CLKN, which may be input respectively to one transistor in each transistor pair. For example, FIG. 4 illustrates the CLKP signal as input to transistors 410, 440, 460 and 470 while the CLKN signal is input to transistors 420, 430, 450 and 480.

During operation, since differential clock signals are input to series connected transistors 410/420, 430/440, 450/460 and 470/480, the cross-point detector 400 should not conduct current through any circuit branch except at times when the clock signals are in a transitional state. For example, in a MOS environment, when the CLKP signal is at VDD and the CLKN signal is at VSS, the NMOS transistors 420, 430, 450 and 480 will be conductive but the PMOS transistors 410, 440, 460 and 470 will not be conductive. The same holds true when the CLKP is at VSS and CLKN is at VDD.

However, when the differential clock signals are in their transition region, where neither differential clock signal is fully either at VDD or VSS, all transistors 410-480 may become partially-conductive. Current may flow from VDD and/or VSS to the output terminal 490 in accordance with the conductivity of the transistors 410-480. Over time, the current output from terminal 490 may reflect a difference between an actual cross-point voltage of CLKP and CLKN and their ideal cross-point voltage. For example, the current may be output to an integrator that may generate the cross-point control voltage to the inverters. In some instances, the current may be passed through an optional buffer in advance of the integrator. Although FIG. 4 depicts an example cross-point detector circuit, it should be understood that alternate configurations may also be implemented.

In an embodiment, the transistors 410-480 may be designed to have size ratios between them to set the ideal cross point voltage at desired levels. For example, the ideal cross-point voltage may be set to the common mode voltage between VDD and VSS (VCM=½(VDD+VSS)). In one implementation, the ratios of the NMOS and PMOS transistors may be set to 0.6 W/0.18 L for NMOS transistors and 0.8 W/0.18 L for PMOS transistors manufactured in a 180 nm process.

FIG. 5 illustrates exemplary waveforms illustrating operation of the cross-point detector of FIG. 3 at various operational states. FIG. 5(a) illustrates a scenario in which output signals CLKP, CLKN cross each other at a voltage VXLO that is lower than the common mode voltage VCM of the circuit. FIG. 5(c) illustrates the converse scenario in which the output signals CLKP, CLKN cross each other at a voltage VXHI that is higher than the common mode voltage VCM. FIG. 5(b) illustrates a scenario in which the circuit is brought into balance, where the output signals CLKP, CLKN cross each other at the common mode voltage VCM.

FIG. 5 also illustrates graph of currents IUP, IDN that flow respectively from the voltage supplies VDD, VSS to the output terminal in each scenario. Current idn represents a current that flows from voltage supply VSS to the output terminal 490 and current IUP represents a current that flows from the voltage supply VDD to the output terminal 490.

In the scenario illustrated in FIG. 5(a), the IUP current is greater than the IDN current. This current may be accumulated in the integrator to generate a corrective control signal to the inverters (FIG. 1). In the scenario illustrated in FIG. 5(c), the IDN current is greater than the IUP current. Again, the current may accumulate in the integrator to generate a corrective control signal to the inverters (FIG. 1) in opposite polarity to the control signal that would be generated in the FIG. 5(a) case. In the scenario illustrated in FIG. 5(b), the IDN and IUP currents may be balance which may cause no accumulation in the integrator and no further modification to the control signal that is passed to the inverters.

FIG. 6 is a block diagram of a clock generator 600 according to an example embodiment. As shown in FIG. 6, the clock generator 600 may include a phase or frequency detector 610, a low pass filter 620, a ring oscillator 630, a feedback divider 640, and an optional clock divider 650.

The phase and/or frequency detector 610 is used in a feedback loop to drive the ring oscillator 630. Here, the phase and/or frequency detector 610 compares a reference clock signal to a feedback clock signal and generates an output signal indicating phase and/or frequency differences between the two clock signals. The output of the phase and/or frequency detector 610 is supplied to low pass filter 620 that generates an output signal representing a low frequency components (or a running average) of the output of the phase and/or frequency detector 610.

The ring oscillator 630 (sometimes called a "voltage controlled oscillator") generates a clock signal based on the control signal supplied by the low pass filter 620. Although not shown, the output of ring oscillator 630 may be supplied to a comparator that converts the output of the ring oscillator 630 into a digital signal. The digital signal output of the comparator is provided to divide-by-N feedback divider 640 and optional clock divider 650.

Feedback divider 640 generates the feedback clock signal derived from the output of the ring oscillator 630, divided down by a first factor N1 as determined by a first control signal. Similarly, optional clock divider 650 generates a divided output clock from the output of the ring oscillator 630, divided down by a second factor N2 as determined by a second control signal. The values of N1 and N2 may be programmable.

In some instances, a clock divider (not shown) optionally may be provided between the reference clock input and the input to the phase and/or frequency detector 610 and may be controlled by its own divider control signal. Provision of the input-side clock divider and/or the output side clock divider 650 provides an additional degree of control of the operational frequency of the clock signal provided by the clock generator 600.

The basic principle behind the extended range voltage controlled oscillator is a common mode circuit that extends the frequency range of the voltage controlled oscillator. Though there are many traditional ways to implement common mode feedback, cross control feedback has a few distinct advantages. Among these, the first advantage is clock fidelity and the second is clock jitter.

Cross control can keep the signals more differential than traditional common mode feedback methods. Traditional methods measure common mode in continuous time. At low frequency clocks the common mode circuit is measuring a static clock signal that has no information. Therefore, the accuracy of traditional common mode methods degrades as the clock frequency decreases. For cross control circuitry, common mode is only measured during clock transitions therefore accuracy is maintained at all frequencies. This allows the voltage controlled oscillator to implement higher-fidelity clocks and/or achieve lower oscillating frequencies than traditional common mode circuits.

Although the foregoing description illustrates embodiments of the present invention as applied to a single loop ring oscillator, the principles of the present invention are not so limited. The common mode control techniques may be applied also to multi-loop ring oscillators as well. Indeed, the principles of the present invention may apply to any differential oscillator having circuit stages that require self-biasing.

It will be apparent to those skilled in the art that various modifications and variations can be made in the extended range ring oscillator using scalable feedback of the present invention without departing form the spirit or scope of the invention. Thus, it is intended that the present invention cover the modifications and variations of this invention provided they come within the scope of the appended claims and their equivalents.

The invention claimed is:

1. A clock system, comprising:
a ring oscillator having a plurality of cascaded inverters, each of the cascaded inverters having a pair of inputs coupled to outputs of a respectively adjacent inverter stage and having a pair of outputs coupled to inputs of another respectively adjacent inverter stage, each inverter stage having a common mode control circuit provided therein, and a feedback controller adapted to transmit a control signal to the common mode control circuit of at least one of the inverters, wherein the feedback controller generates the control signal based on a frequency of the ring oscillator.

2. The clock system according to claim 1, further comprising an amplifier provided between the ring oscillator and the feedback controller, outputting the clock signal from the ring oscillator.

3. The clock system according to claim 1, wherein each of the plurality of inverters imposes a respective delay on propagation of a differential clock signal through the ring oscillator.

4. The clock system according to claim 3, wherein the delay differs between at least two of the plurality of inverters.

5. The clock system according to claim 1, wherein the feedback controller includes a cross-control circuit.

6. The clock system according to claim 5, wherein the cross-control circuit measures a common mode of the clock signal during clock transitions.

7. The clock system according to claim 5, wherein the cross-control circuit generates an output during clock transitions.

8. The clock system according to claim 5, wherein the cross-control circuit generates the control signal, and the control signal is proportional to the frequency of the ring oscillator.

9. A clock system, comprising:
amplifier stage including ring oscillator having a plurality of cascaded differential inverters, each inverter having a common mode control circuit provided therein;
a trans-conductance stage providing a pair of signals having a trans-conductance that is proportional to an oscillation frequency of the ring oscillator; and
an integrator stage that integrates a difference between a target common mode voltage and a common mode voltage.

10. A method for operating a clock system, comprising:
supplying a pair of clock signals from ring oscillator generated by a plurality of cascaded inverters; and
controlling a common mode operating point of at least one inverter by:
determining from cross-points of transitions of the clock signals, a deviation of the cross-points from idealized cross-points of those clock signals,
developing a control signal from the determination, wherein the control signal varies based on a frequency of the ring oscillator, and
passing the control signal to the at least one inverter as a feedback signal.

11. The method according to claim 10, wherein an amplifier is disposed between the ring oscillator and a feedback controller.

12. The method according to claim 10, wherein each of the plurality of cascaded inverters is configured with a predetermined delay.

13. The method according to claim 12, wherein the predetermined delay differs between at least two of the plurality of inverters.

14. The method according to claim 11, wherein the feedback controller includes a cross-control circuit.

15. The method according to claim 14, wherein the cross-control circuit measures a common mode during clock transitions.

16. The method according to claim 14, wherein the cross-control circuit generates an output during clock transitions.

17. The method according to claim 14, wherein the cross-control circuit generates -the control signal, and the control signal is proportional to the frequency of the ring oscillator.

18. The clock system according to claim 1, wherein the common mode control circuit includes a common mode control transistor.

19. The clock system according to claim 9, wherein the common mode voltage has a value that is between a value of a first supply voltage and a value of a second supply voltage.

20. The method according to claim 10, wherein the control signal is developed by integrating a signal representative of the deviation.

* * * * *